US009245766B2

(12) United States Patent
Wang et al.

(10) Patent No.: US 9,245,766 B2
(45) Date of Patent: Jan. 26, 2016

(54) MEMORY CIRCUIT STRUCTURE AND SEMICONDUCTOR PROCESS FOR MANUFACTURING THE SAME

(71) Applicant: Powerchip Technology Corporation, Hsinchu (TW)

(72) Inventors: Zih-Song Wang, Hsinchu (TW); Chia-Ming Wu, Taipei (TW)

(73) Assignee: Powerchip Technology Corporation, Hsinchu Science Park, Hsinchu (TW)

( * ) Notice: Subject to any disclaimer, the term of this patent is extended or adjusted under 35 U.S.C. 154(b) by 0 days.

(21) Appl. No.: 14/280,688

(22) Filed: May 19, 2014

(65) Prior Publication Data

US 2015/0137204 A1    May 21, 2015

(30) Foreign Application Priority Data

Nov. 21, 2013  (TW) .............................. 102142417 A

(51) Int. Cl.
*H01L 27/115* (2006.01)
*H01L 21/3213* (2006.01)
*H01L 21/033* (2006.01)

(52) U.S. Cl.
CPC ...... *H01L 21/32139* (2013.01); *H01L 21/0337* (2013.01); *H01L 27/1157* (2013.01); *H01L 27/11524* (2013.01)

(58) Field of Classification Search
CPC ..................... H01L 21/30608; H01L 21/0272; H01L 21/028; H01L 21/0276; H01L 27/115
USPC .......... 257/314, 618, E21.158; 438/669, 694, 438/696, 702, 703
See application file for complete search history.

(56) References Cited

U.S. PATENT DOCUMENTS

| 2010/0075503 | A1* | 3/2010 | Bencher et al. ............... 438/703 |
| 2010/0197139 | A1* | 8/2010 | Koh et al. ..................... 438/694 |
| 2010/0297850 | A1  | 11/2010 | Kim |
| 2011/0318931 | A1* | 12/2011 | Min et al. ..................... 438/696 |
| 2013/0105948 | A1* | 5/2013 | Kewley .......................... 257/618 |

FOREIGN PATENT DOCUMENTS

| TW | 201203363 | 1/2012 |
| TW | 201340208 | 10/2013 |

* cited by examiner

*Primary Examiner* — Kenneth Parker
*Assistant Examiner* — Young W Kim
(74) *Attorney, Agent, or Firm* — Winston Hsu; Scott Margo

(57) ABSTRACT

A semiconductor process for manufacturing particular patterns includes the steps of forming a target layer and evenly-spaced core bodies on a substrate, conformally forming a hard mask layer, forming a first photoresist covering a predetermined region on the hard mask layer wherein the predetermined region encompasses at least two core bodies, performing a first etch process to remove a portion of the hard mask layer outside the predetermined region and expose a number of core bodies, removing the exposed core bodies, forming a second photoresist at least encompassing all the recesses in the predetermined region, and performing a second etch process to pattern the target layer.

10 Claims, 7 Drawing Sheets

MEMORY CIRCUIT STRUCTURE AND SEMICONDUCTOR PROCESS FOR MANUFACTURING THE SAME

BACKGROUND OF THE INVENTION

1. Field of the Invention

The present invention relates generally to a memory circuit structure and the semiconductor process for manufacturing the same, and more particularly, to a semiconductor process for manufacturing NAND flash circuit structure using spacer self-aligned double patterning (SADP) scheme.

2. Description of the Prior Art

The principle of a photolithographic process is to transfer a circuit pattern on a mask to a wafer by a method of exposure and development, thereby producing specific circuit patterns on the wafer. However, with the trend towards scaling down the semiconductor products, the conventional photolithographic technologies face formidable challenges. Take mainstream ArF excimer laser method with wavelength of 193 nm for example, the reachable minimum half-pitch of a transistor device produced by this kind of light source during exposure in the photolithographic process is 65 nm. By incorporating the well-known immersion lithography technology, the reachable half-pitch maybe further reduced to 45 nm, which is almost the physical limitation in the photolithographic processes. For this reason, if the half-pitch of the semiconductor device need to go under 45 nm, the industry needs to utilize more advanced photo-lithographic technologies, such as a double patterning technology, an extreme ultra violet (EUV) technology, a maskless photolithography (ML2) technology or a nano-imprint technology, etc.

Double patterning is one of most mature methods within the aforementioned various advanced photolithography technologies. The double patterning technology enables the use of current available photolithographic tools to produce desired finer circuit patterns, without the requirement of purchasing extremely expensive advanced photolithography tools, thereby avoiding huge investments. As the double patterning technology and relevant equipment gradually mature in the industry, the 193 nm immersion lithography technology once limited by the physical limits can be further applied to the advanced process nodes of 32 nm, or even 22 nm, thereby becoming the mainstream photolithographic technology for the next semiconductor generation.

The principle of the double patterning technology is to separate one compact semiconductor circuit pattern into two alternative or complementary circuit patterns. The two separate patterns will be transferred respectively by the photolithographic process and then be combined on one wafer to obtain the final completed circuit pattern. The use of double patterning technology in nowadays NAND flash processes can produce word lines or bit lines with intervals smaller than 28 nm, thereby significantly improving the memory capacity in memory blocks.

With regard to the application of conventional self-aligned double patterning technology in the manufacture of the NAND flash memory, especially in the manufacture of word lines and select gates in the string area, since the widths of circuit features and/or the intervals therebetween are scaled down to dozens of nanometer, the micro-loading effect resulting from the different densities of the circuit features in the processes may be significantly amplified, so that it is difficult to form the pattern features with good profile characteristics, such as critical dimension uniformity (CDU), line width roughness and line edge roughness, etc., in both the open areas and the dense areas of the circuit pattern. To solve this problem, the common solution in the industry is to dispose additional dummy patterns, ex. dummy word lines, at the boundary between dense regions and open regions, such as the boundary between word line patterns and select gate patterns in a string area. The dummy patterns may serve as a sacrificial structure to replace the non-uniformed circuit features formed by using conventional double patterning method, so that the patterns other than the dummy patterns in the layout may have uniform circuit profiles and characteristics.

In addition to the above-mention approach of dummy patterns, certain process schemes are developed in the industry, which features the use of regular patterns to manufacture circuit pattern with different widths. Please now refer to FIG. 1, which schematically depicting a process scheme for manufacturing a select gate using regular patterns in prior art. As shown in FIG. 1, a poly-silicon layer 12 is formed on a substrate 10 to form word lines and select gates. A plurality of spacers 14 manufactured by double patterning method are formed on the poly-silicon layer 12 to define the pattern of word lines. A flat layer 16 made of planarizable material (ex. an anti-reflective layer) covers the spacers 14 and poly-silicon layer 12. In this process scheme, a photoresist 18 is disposed on the flat layer 16 to define desired select gate region. The photoresist 18 would cover several spacers 14, and preferably, the edges of photoresist 18 are located respectively on the two spacers and do not extend beyond. The select gate and corresponding word lines manufactured by this process scheme would have regular spacing.

However, it is known to those skilled in the art that the photoresist is impossible to be 100 percent precisely located on the predetermined position. To define by the exposure limitation value F of the photolithographic tool, as it can be obviously known from FIG. 1, the photoresist 18 is possible to have an F/2 offset. The F/2 offset maybe half the spacing d between the word lines in current semiconductor technology level, which the dimension of the word line may be configured at several dozens of nanometers. In such severe overlay shift, the spacing of finally-made select gate and adjacent word lines would be severely out of spec and impact the electrical performance of the device. Therefore, it is still urgent to those of skilled in the art to develop or improve the conventional double patterning scheme for the requirement of nano-scale width and density in the semiconductor technology nowadays.

SUMMARY OF THE INVENTION

As an improved scheme to conventional skills, a novel memory circuit structure and semiconductor process for manufacturing the same are provided in the present invention. The process is an improved positive self-aligned double patterning (P-SADP) scheme in the semiconductor technology. With specific process flow, uniform line patterns may be formed in the string of the memory circuit layout. It is unnecessary to dispose additional dummy patterns in the layout like those used in conventional process schemes. The advantage of the present invention is that line structures with different widths can be formed by using regular and uniform patterns and the complexity of process scheme is, therefore, reduced.

One object of the present invention is to provide a semiconductor process for manufacturing particular patterns. The process includes the steps of sequentially forming a target layer and a plurality of evenly-spaced core bodies having uniform width on a substrate, conformally forming a hard mask layer on the target layer and core bodies so that a plurality of recesses are formed between two adjacent core bodies in the hard mask layer, forming a first photoresist on the hard mask layer wherein the first photoresist covers a predetermined region encompassing at least two core bodies and at least one recess, performing a first etch process using the first photoresist as an etch mask to remove the hard mask layer outside the predetermined region so that the core bodies outside the predetermined region are exposed, removing the exposed core bodies to expose underlying target layer, forming a second photoresist on the hard mask layer in the predetermined region, wherein the second photoresist at least encompasses all of recesses in the predetermined region, and performing a second etch process using remaining hard mask layer and the second photoresist as an etch mask to pattern the target layer.

Another object of the present invention is to provide a memory circuit structure including a substrate, a plurality of word lines disposed and evenly-spaced on the substrate, wherein the width of said word lines is F, and a select gate adjacent to the word lines, wherein the width of the select gate is (7+4n)F, and n is positive integer larger or equal to 1.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
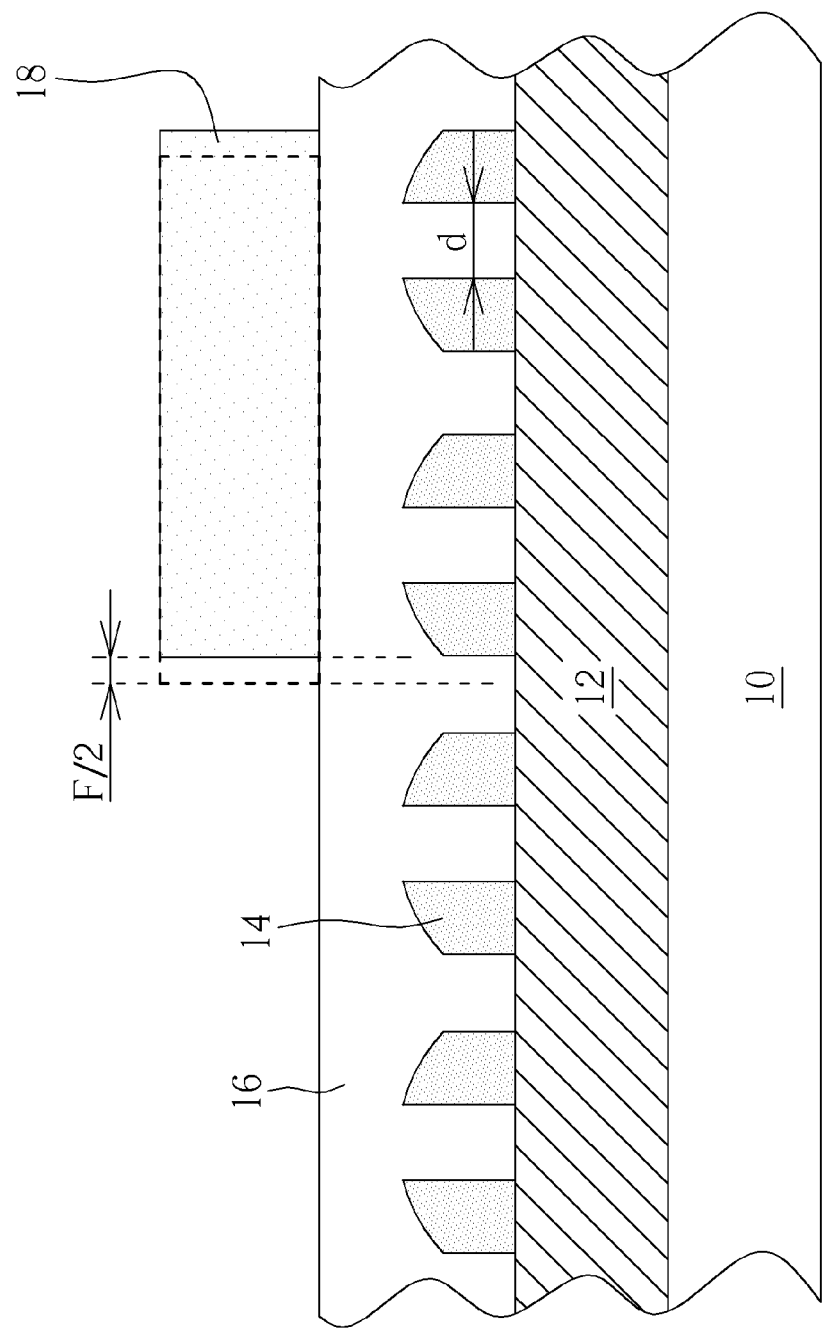
FIG. 1 is a cross-sectional view schematically depicting a process scheme for manufacturing a select gate using regular patterns in prior art.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings which form a part hereof and is shown by way of illustration and specific embodiments in which the invention may be practiced. These embodiments are described in sufficient details to enable those skilled in the art to practice the present invention. It should be noted that the present invention may utilize other embodiments, or structural, logical, and electrical changes maybe made without departing from the scope of the present invention. Therefore, the following detailed description is not intended to be taken in a limiting sense, and the scope of the present invention is defined by the appended claims. Furthermore, certain terms are used throughout following description and appended claims to refer to particular components. As one skilled in the art will comprehend, the manufacturers of the semiconductor device may refer to a component as different names, such as spacer, liner, insulators and dielectrics, etc.

The embodiments will now be explained hereafter with reference to the accompanying drawings to provide a better understanding of the process of the present invention, wherein FIGS. 2-7 are cross-sectional views schematically depicting a semiconductor process in accordance with one preferred embodiment of present invention. The process of the present invention is an improved spacer self-aligned double patterning (SADP) scheme, in which detailed steps and features claimed therein can solve the problem that conventional SADP process can't manufacture uniform circuit patterns due to the overly limitation of the photolithographic tool and, thereby, improve the performance of the devices.

Figure 2:
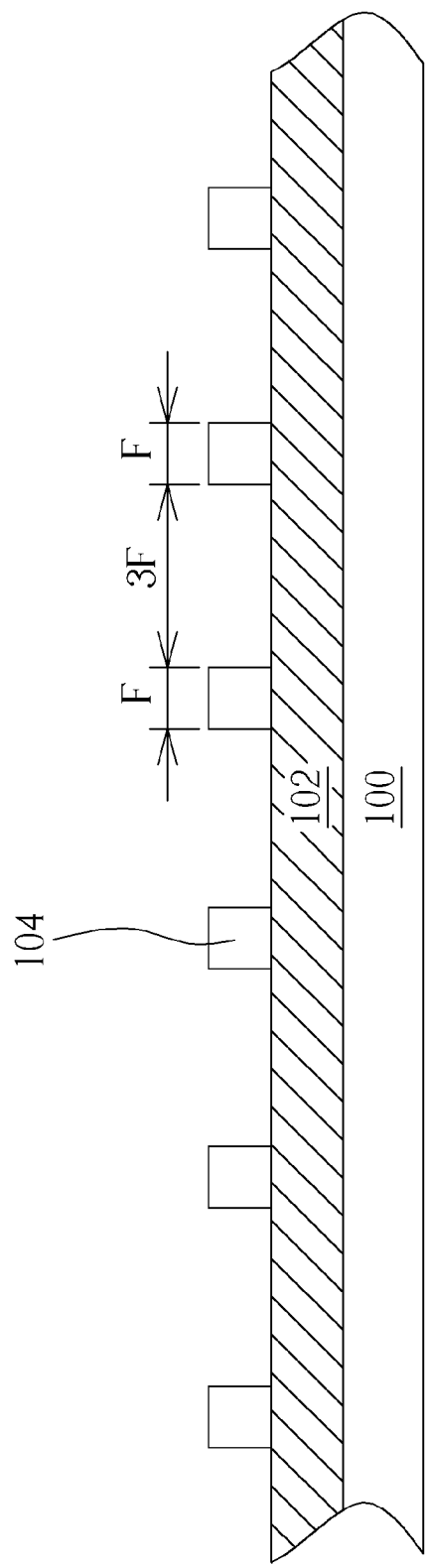
FIGS. 2-7 are cross-sectional views schematically depicting a series of main steps of the semiconductor circuit process in accordance with one preferred embodiment of present invention.

Please refer to FIG. 2. A substrate 100 is first provided as a base for the semiconductor devices in the structure of the present invention. A target layer 102, such as a conductive layer, and a plurality of evenly-spaced core bodies 104 are sequentially formed on the substrate 100. The target layer 102 is configured to be patterned into the components of all kinds of semiconductor devices or conductive circuits in following processes. For example, in this embodiment, the target layer 102 is used to form conductive circuits, such as word lines, bit lines or select gates in a layout of memory circuit. The substrate 100 may include silicon substrate, a silicon-containing substrate, a GaN-on-silicon (or other material of Group III-V), a grapheme-on-silicon substrate or a silicon-on-insulator (SOI) substrate and so on, but not limited to a semiconductor substrate. The concept of the present invention may also be applied to other technical fields, such as the field of display panel. For example, the substrate may be an insulating glass substrate or a quartz substrate. The material of the target layer 102 may include, but is not limited to, a conductive material, such as polycrystalline silicon, amorphous silicon, salicide or metal material, and it may also be a semiconductor material or an insulating material, such as tetra-ethoxysilane (TEOS). The material of the core bodies 104 may include, but is not limited to, silicon nitride, silicon oxide, polycrystalline silicon and amorphous silicon. The core bodies 104 and the target layer 102 should have different etch selectivity ratio. That is, the core bodies 104 and the target layer 102 would have different etching rates in the same etch process, so that core bodies 104 may be selectively removed in the process.

Refer again to FIG. 2. In the embodiment, a plurality of core bodies 104 may be formed by patterning a core layer (not shown) using a photolithographic process and an etching process. The core bodies 104 are in the form of a plurality of evenly-spaced lines when viewed from the top, such as the word lines in NAND string of a memory layout. The above-mentioned photolithographic process and etching process are well-known skills in the art, thus redundant description is herein omitted for simplicity. The width of core body 104 may be set at the exposure limit value F of the photolithographic tool used in the process. For example, mostly-used ArF excimer laser stepper (with an exposure wavelength of 193 nm) is currently utilized to manufacture the line feature with critical dimension (CD) of 56 nm, thus the exposure limit value F in this example is 56 nm. In the embodiment, the spacing between the core bodies 104 may be set at the value triple the width F of the core body 104, i.e. 3F. In such configuration, the target layer 102 may be transformed into smaller, evenly-spaced pattern features, such as regularly-arranged word lines and bit line in NAND string, with uniform width in following SADP process. Detailed steps will be provided in the following embodiment.

It may be understood from FIG. 2 that the photoresist patterns used to define core bodies 104 in the present invention are regular pattern with uniform size and density. For example, the width of all core bodies 104 are identically F, and all spacing between each core body 104 is identically 3F. The above-mentioned uniform photoresist pattern can significantly mitigate the micro-loading effect resulted from the pattern features with different densities. Moreover, in other embodiment, a trimming process may be further performed to reduce the width of core bodies 104 to manufacture even finer line structure in following processes.

Figure 3:
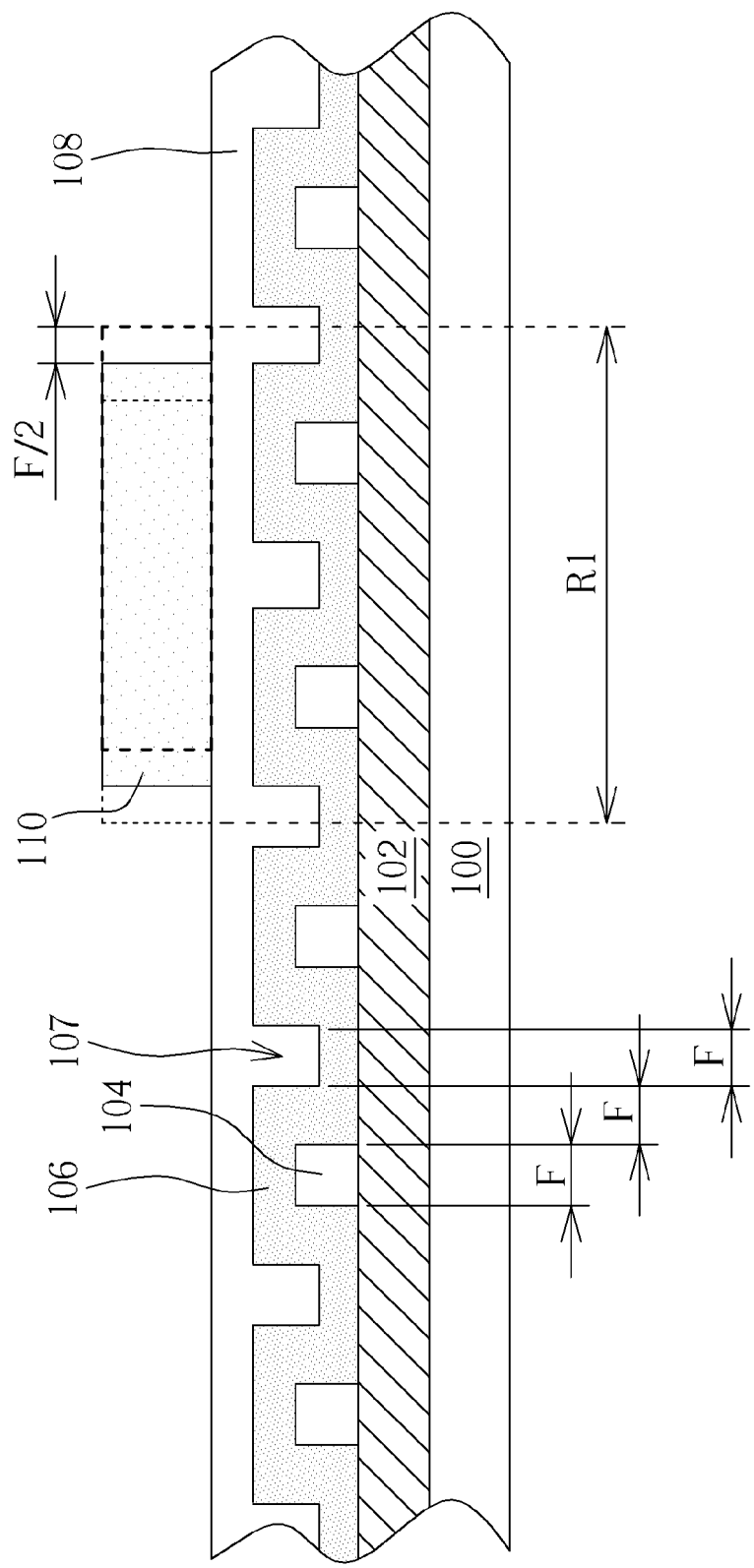

Please now refer to FIG. 3, after core bodies 104 are defined, a deposition process is performed on the substrate 100 to form a spacer material layer 106. The spacer material layer 106 is conformally formed on the surface of target layer 102 and each core body 104 by, for example, atomic layer deposition (ALD), thus uniform thickness may be easily achieved. In such configuration a recess 107 will be formed between each core body 104 after the deposition. In the embodiment, the thickness of the spacer material layer 106 is set at the value the same as the width F of core body 104. The recess 107 therebetween would accordingly have the same width F (=3F−F−F). This configuration is essential to form the pattern feature with identical width and spacing in following processes. In the embodiment of the present invention, the material of the spacer material layer 106 may include, but is not limited to, silicon nitride, silicon oxide or polycrystalline silicon, etc. The spacer material layer 106 and the core bodies 104 should have different etch selectivity ratio. That is, the core bodies 104 and the spacer material layer 106 would have different etching rates in one etch process, so that core bodies 104 may be selectively removed according to the scheme. In the process scheme of the present invention, the spacer material layer 106 is configured to form spacers at both sides of each core bodies 104. The thickness of the spacer material layer 106 would be preferably set at the value the same as the width of finally-formed desired smaller pattern (ex. word lines).

Refer again to FIG. 3, after the conformal spacer material layer 106 is formed, optionally, a flat layer 108 may be formed on the spacer material layer 106 to provide a flat surface. The flat layer 108 may be a bottom anti-reflective coating (BARC) or a tri-layer structure to provide a planarized profile. A photoresist 110 (referred hereinafter as first photoresist) is then formed on the flat layer 108. In the embodiment, the first photoresist 110 covers a predetermined region R1 which is used to define the desired larger pattern features, such as a select gate in corresponding layout of memory circuit. Since the first photoresist 110 is used to define larger pattern features, the predetermined region R1 would substantially encompass at least two core bodies 104 (ex. two core bodies are encompassed in the embodiment). The number of encompassed core bodies 104 depends on the width of desired larger pattern features to be defined. The planarization condition provided by the flat layer 108 may help to form the first photoresist 110 on the substrate more reliably, and the anti-reflection effect may help to define the photoresist patterns more precisely in following photolithographic process. On the other hand, the dashed frames shown in FIG. 3 represent the overlay shift of the first photoresist 110 offset respectively to left and right. To define the overlay shift behavior by the above-identified exposure limit value F of the photolithographic tool used in the process, the largest offset is set at value of F/2. This configuration implies that the first photoresist 110 would not cover beyond the recesses 107 at both sides of the predetermined region R1. Therefore, the pattern definition would not be affected by inevitable overlay shift. It should be noted that the flat layer 108 is unnecessary on certain conditions. The first photoresist 110 may be formed directly on the spacer material layer 106 without the flat layer 108.

Figure 4:
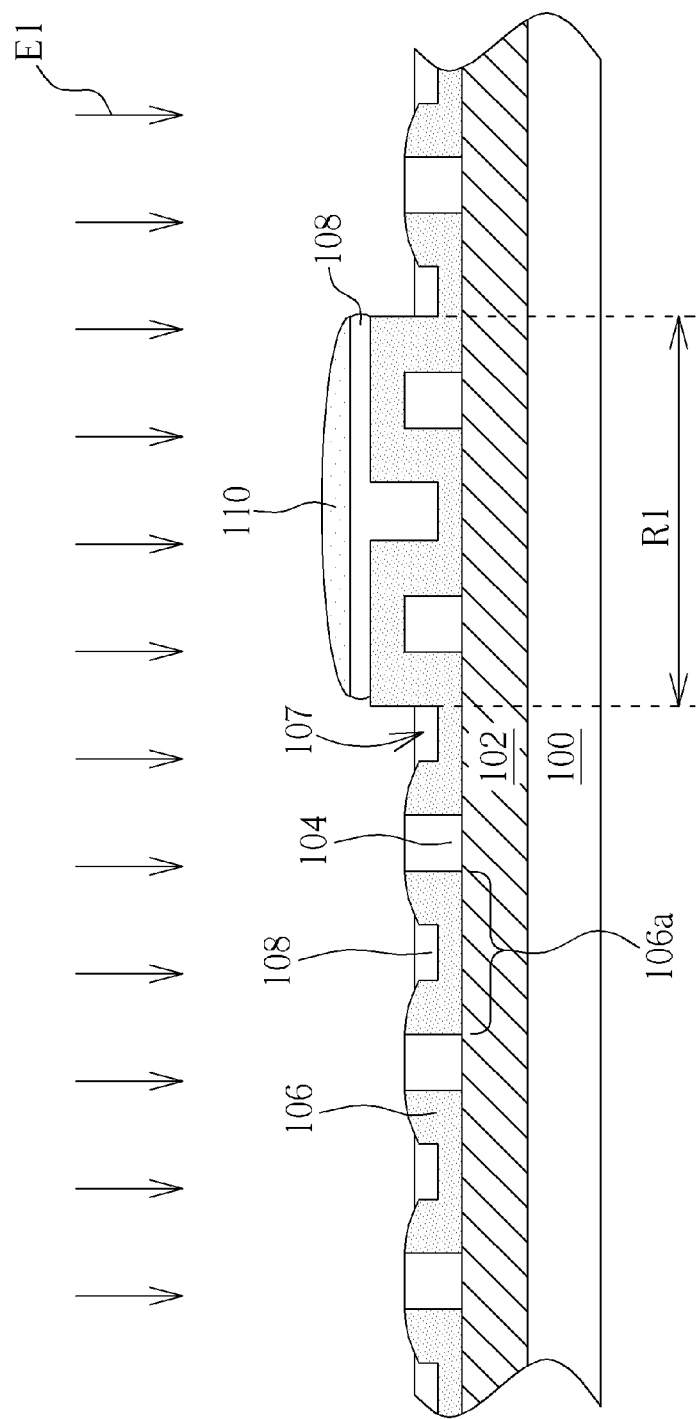

Please now refer to FIG. 4. After the flat layer 108 is formed and the predetermined region R1 is defined by the first photoresist 110, an etch process E1 (referred hereinafter as first etch process) is then performed using the first photoresist 110 as an etch mask. In the embodiment, the first etch process E1 is an anisotropic etch back process, which may remove a portion of the flat layer 108 and the spacer material layer 106 with a certain thickness. More specifically, it may completely remove the spacer material layer 106 on all core bodies 104 outside the predetermined region R1 and expose those core bodies 104. The spacer material layer 106 and the core bodies 104 within the predetermined region R1 are intact in this etch step because they are protected by the first photoresist 110. It can be known from FIG. 4 that a portion of flat layer 108 remains in the recesses 107 defined by the spacer material layer 106 after the first etch process E1. Alternatively, there may be no remaining flat layer in the recesses 107. The spacer material layer 106 is divided into several spacers 106a in concave shape because the core bodies 104 are exposed, wherein each spacer 106a has a recess 107 formed thereon.

Figure 5:
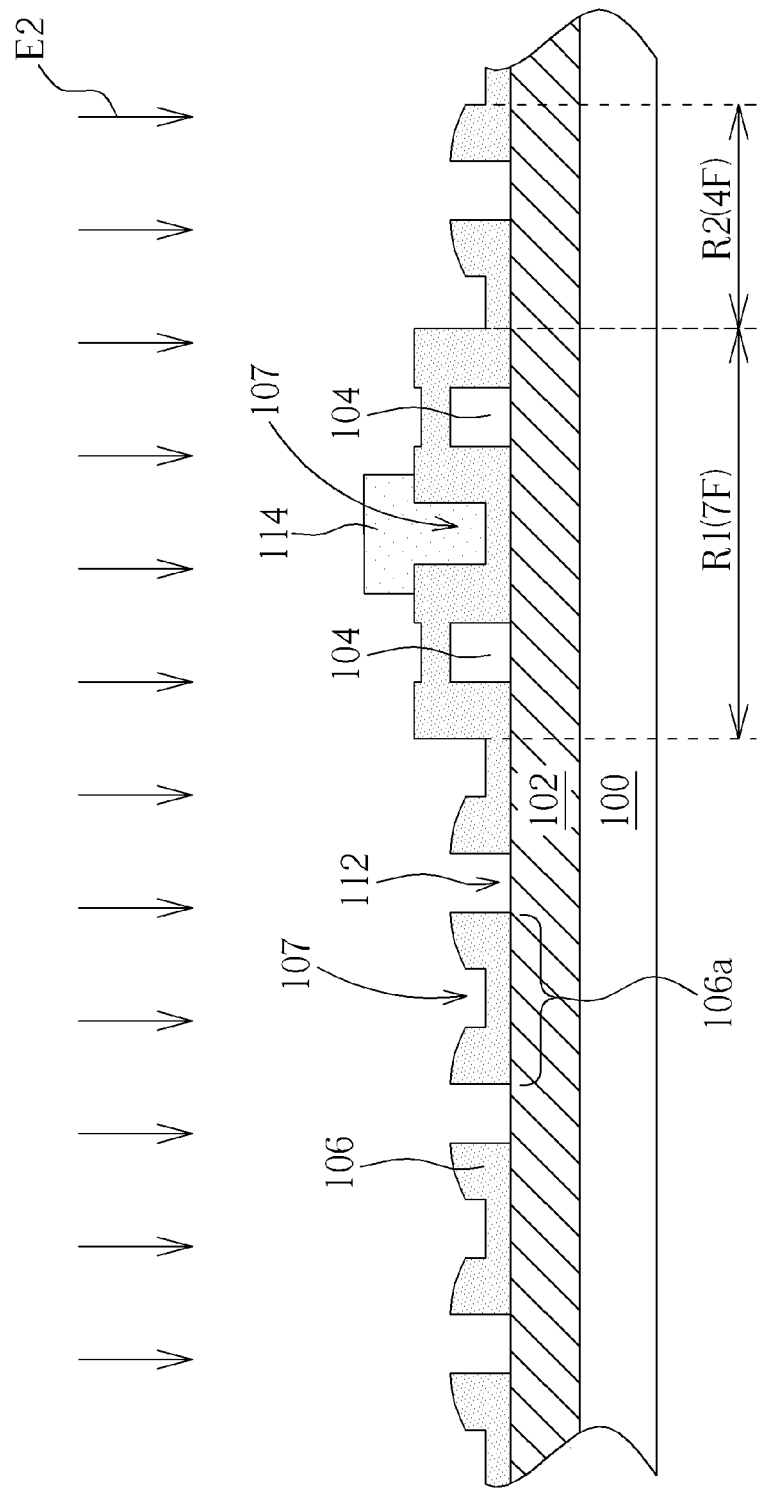

Please now refer to FIG. 5. After the first etch process E1 is performed, the first photoresist 110, remaining flat layer 108 and exposed core bodies 104 on the substrate are then removed, thereby forming several protruding, concave-shaped spacers 106a. The recess 112 between the spacer 106a exposes the underlying target layer 102. In the embodiment, since the predetermined region R1 encompasses at least two core bodies 104, the spacer material layer 106 would have at least one recess 107 formed thereon. In order to prevent the following etch process etch through the recess 107 in the predetermined region (s) R1 and impact the definition of the larger pattern, another photoresist 114 (referred hereinafter as second photoresist) is formed on the spacer material layer 106 in the predetermined region R1 to serve as a mask. In the embodiment, the region encompassed by the second photoresist 114 may be smaller than the predetermined region R1. However, in order to protect the underlying structures, the second photoresist 114 should encompass at least all the recesses 107 in the predetermined region R1, as shown in FIG. 5.

Figure 6:
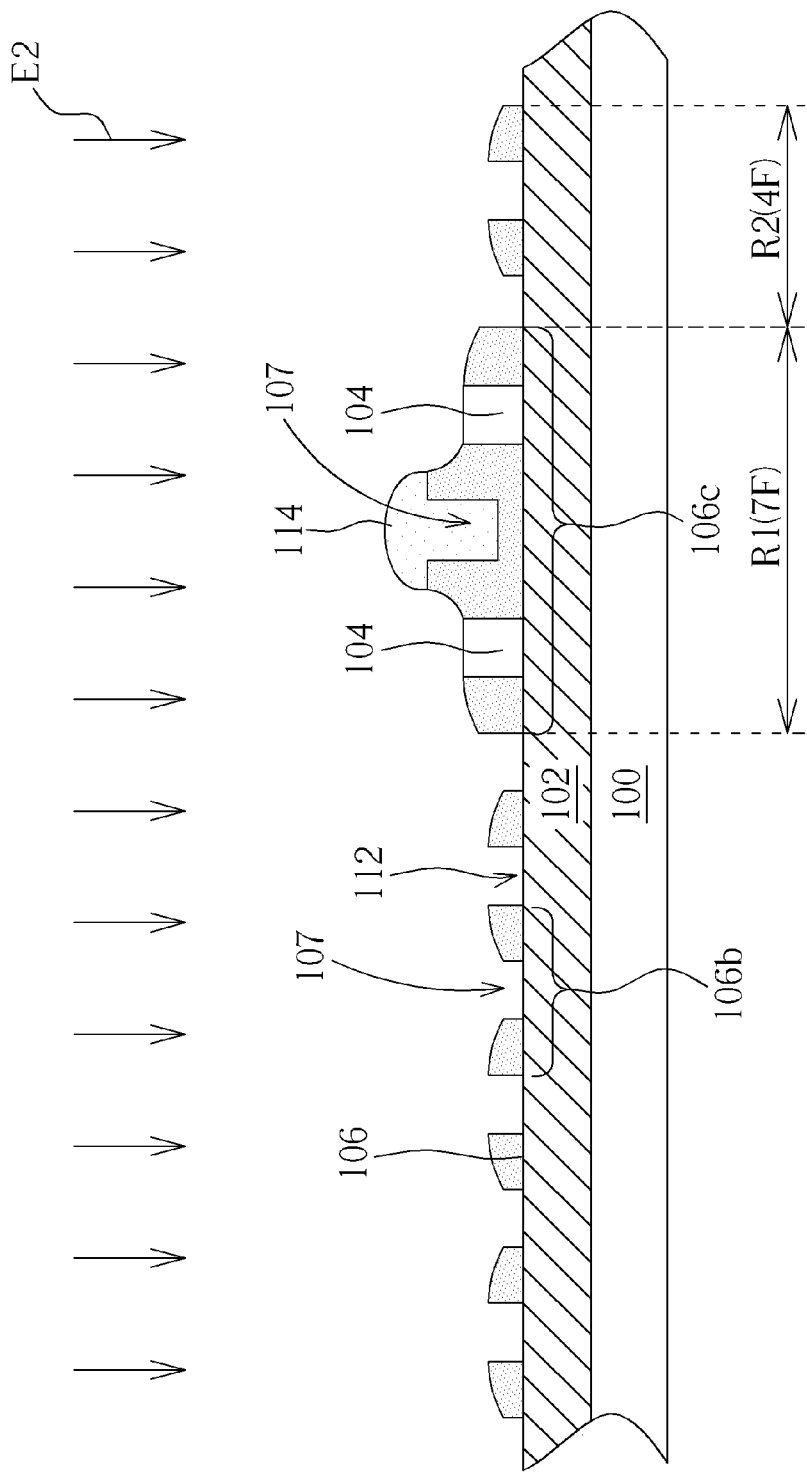

Please now refer to FIG. 6. After a number of core bodies 104 are removed and the second photoresist 114 is formed, an etch process E2 (referred hereinafter as second etch process) is further performed using the remaining spacer material layer 106 and the second photoresist 114 as a mask. In the embodiment, the second etch process E2 is also an anisotropic etch back process, which may remove a portion of the spacer material layer 106 and the exposed target layer 102 thereunder with a certain thickness. More specifically, it may completely remove the spacer material layer 106 under the recesses 107 outside the predetermined region R1, so as to expose and etch the target layer 102 under those recesses 107. Please note that the second etch process E2 has higher etching rate to target layer 102 than to the spacer material layer 106, thus only the relatively thinner portion of the spacer material layer 106 under the recesses 107 outside the predetermined region R1 would be completely removed, while other relatively thicker portion of the spacer material layer 106 would not be completely removed. Moreover, since the region under the recesses 107 in the predetermined region R1 is protected by the second photoresist 114, no target layer 102 in said region would be exposed and etched, thus the desired larger pattern features to be defined in the predetermined region R1 may be maintained. In such configuration, the concave-shaped spacer 106a outside the predetermined region R1 would gradually transform into smaller, evenly-spaced spacers 106b (i.e. the desired smaller pattern to be defined, such as word lines) with uniform width during the second etch process E2. Moreover, in such configuration, no spacer material layer in the predetermined region R1 is etched through and exposes the underlying target layer, thus desired larger pattern features (ex. a select gate pattern) defined in whole predetermined region R1 may be maintained.

Figure 7:
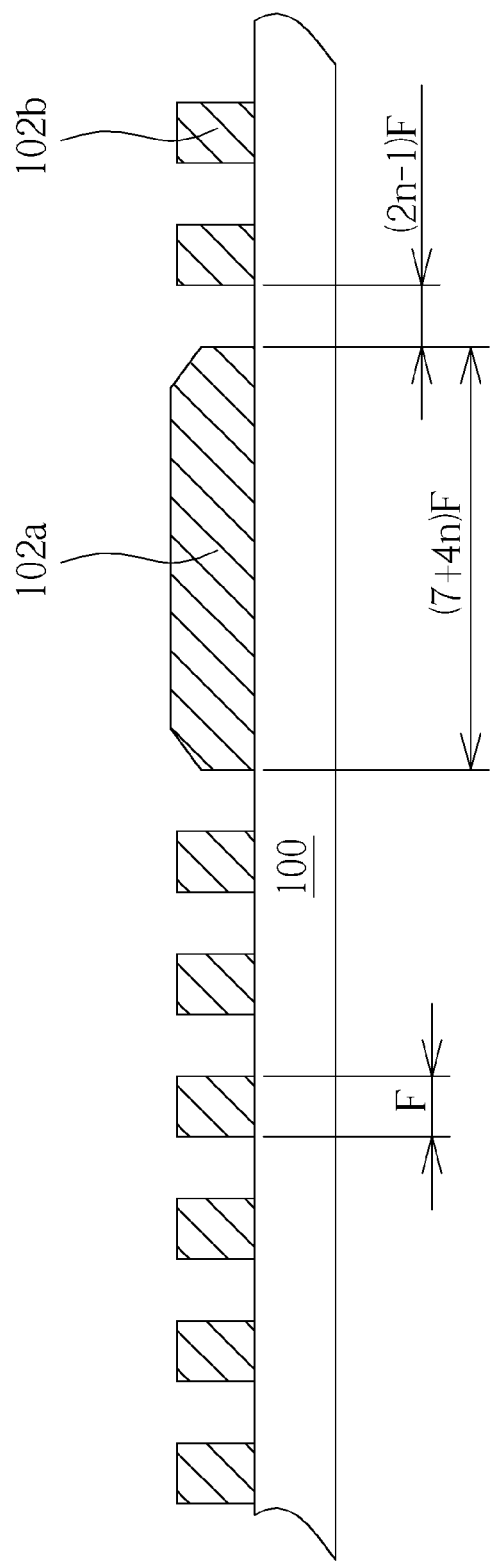

The second etch process E2 would continue to etch the target layer 102 using the pattern formed in the process as a mask, as shown in FIG. 6, so as to form final circuit structure including smaller pattern features 102b (ex. a plurality of word lines) with uniform width F and spacing F and a larger pattern feature 102a (ex. a select gate) as shown in FIG. 7. The semiconductor process provided by the present invention is, accordingly, completed.

The final pattern formed by the target layer after a series of process steps provided above would include smaller pattern features with uniform profile. It is unnecessary like those commonly used in conventional process schemes to dispose one or more dummy patterns (ex. sacrificial word lines) at both sides of the circuit region adjacent to the predetermined position of the select gates at the start of the pattern definition, thus available space for circuit layout may be significantly increased. The advantage of the present invention fundamentally derive from the configuration that all kinds of patterns formed in the series of process steps are defined and transformed by evenly-spaced core bodies 104 shown in FIG. 2. The condition of uniform pattern density of those core bodies can significant mitigate the micro-loading effect when manufacturing nano-scale fine line pattern. Moreover, in the process steps, the requirement of the first photoresist 110 is to encompass at least two core bodies 104, thus the overlay shift window may be increased up to 1.5F, and the requirement of the second photoresist 114 is to encompass the recesses 107 in the predetermined region R1, thus its overlay shift window may also be increased up to 1.5F. Both overlay shift windows are larger than the exposure limit F of photolithographic tool nowadays, thus common overlay shift issue in prior may be properly solved.

On the other hand, since the semiconductor process of the present invention is based on regular patterns, the defined circuit pattern would have specific sizes and features. For example, as shown in FIG. 5, the predetermined region R1 encompasses two core bodies, which is totally a region of 7F width on the substrate, including the width of two core bodies (2F), the thickness of two spacers (2F) and a spacing between the core bodies (3F). If the predetermined region R1 encompasses more core bodies 104, as shown in the figure, an additional region R2 with 4F width would be defined for each more core body 104 encompassed. In such configuration, the width of the predetermined region R1 in the embodiment may be represented by (7+4n) F, which is also the width of the finally-made larger pattern features 102a. The spacing between the larger pattern feature 102a and the smaller pattern feature 102b is (2n31 1) F, wherein n is positive integer larger or equal to 1.

Accordingly, the semiconductor process provided by the present invention may manufacture circuit structure with particular patterns. As shown in FIG. 7, the circuit structure may include: a substrate, a plurality of word lines disposed and evenly-spaced on the substrate with uniform width F, and a select gate adjacent to the word lines, wherein the width of the select gate is (7+4n) F and the spacing between the select gate and the word line is (2n−1)F, and n is positive integer larger or equal to 1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process for manufacturing particular patterns, comprising the steps of:
    sequentially forming a target layer and a plurality of evenly-spaced core bodies having uniform width on a substrate;
    conformally forming a spacer material layer on said target layer and said core bodies so that a plurality of recesses are formed between two adjacent said core bodies in said spacer material layer;
    forming a first photoresist on said spacer material layer, wherein said first photoresist covers a predetermined region encompassing at least two said core bodies and at least one said recess;
    performing a first etch process using said first photoresist as an etch mask to remove said spacer material layer outside the said predetermined region so that said core bodies outside said predetermined region are exposed;
    removing said exposed core bodies to expose underlying said target layer;
    forming a second photoresist on said spacer material layer in said predetermined region, wherein said second photoresist at least encompasses all of said recesses in said predetermined region; and
    performing a second etch process using remaining said spacer material layer and said second photoresist as an etch mask to pattern said target layer.

2. A semiconductor process for manufacturing particular patterns according to claim 1, further comprising forming a flat layer on said spacer material layer before forming said first photoresist.

3. A semiconductor process for manufacturing particular patterns according to claim 2, wherein said first etch process is an anisotropic etch process which removes a portion of said flat layer outside said predetermined region.

4. A semiconductor process for manufacturing particular patterns according to claim 3, wherein the step of removing said exposed core bodies comprises removing said first photoresist and remaining said flat layer.

5. A semiconductor process for manufacturing particular patterns according to claim 2, wherein said flat layer is an anti- reflective layer.

6. A semiconductor process for manufacturing particular patterns according to claim 1, wherein the spacing between said core bodies is triple the width of said core bodies.

7. A semiconductor process for manufacturing particular patterns according to claim 1, wherein said spacer material layer has uniform thickness corresponding to the width of word lines or the width of bit lines to be formed.

8. A semiconductor process for manufacturing particular patterns according to claim 1, wherein said predetermined region corresponds to the select gate to be formed.

9. A semiconductor process for manufacturing particular patterns according to claim 1, wherein said particular pattern is a plurality of word lines, a plurality of bit lines or a select gate.

10. A semiconductor process for manufacturing particular patterns according to claim 1, wherein said second etch process is an anisotropic etch process which removes said spacer material layer under said recesses out of said predetermined region so that said spacer material layer out of said predetermined region changes into a plurality of evenly-spaced spacers with uniform width.

* * * * *